(12) United States Patent
Kim

(10) Patent No.: US 7,531,045 B2
(45) Date of Patent: May 12, 2009

(54) METHOD FOR REMOVING HAZE IN A PHOTO MASK

(75) Inventor: Mun Sik Kim, Cheongju-Si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/112,862

(22) Filed: Apr. 30, 2008

(65) Prior Publication Data

US 2008/0202560 A1    Aug. 28, 2008

Related U.S. Application Data

(62) Division of application No. 11/770,528, filed on Jun. 28, 2007, now abandoned.

(30) Foreign Application Priority Data

Dec. 29, 2006  (KR) ................ 10-2006-138850

(51) Int. Cl.
    *B08B 7/00*    (2006.01)
(52) U.S. Cl. ............... 134/19; 134/21; 134/26; 134/30; 134/42; 134/902; 438/725; 438/736; 438/745; 438/750; 216/12; 216/58

(58) Field of Classification Search ............ 134/19, 134/21, 26, 30, 42, 902; 216/12, 58; 438/725, 438/736, 745, 750
See application file for complete search history.

(56) References Cited

U.S. PATENT DOCUMENTS

| 7,186,301 | B2 | 3/2007 | Kim et al. | |
| 2002/0072016 | A1 | 6/2002 | Chen et al. | |
| 2006/0019177 | A1* | 1/2006 | Mori et al. | 430/5 |
| 2006/0137717 | A1 | 6/2006 | Lee | |
| 2006/0207633 | A1* | 9/2006 | Kim et al. | 134/28 |
| 2008/0156353 | A1* | 7/2008 | Kim | 134/19 |
| 2008/0185021 | A1* | 8/2008 | Chiu et al. | 134/28 |

FOREIGN PATENT DOCUMENTS

| KR | 10-0612329 | 8/2006 |
| KR | 10-0612330 | 8/2006 |

* cited by examiner

*Primary Examiner*—Sharidan Carrillo
(74) *Attorney, Agent, or Firm*—Marshall, Gerstein & Borun LLP

(57) ABSTRACT

An apparatus for removing haze in a photo mask includes sealed chamber having a bake module disposed therein to support a photo mask, a reactant gas feed line to feed a reactant gas into the chamber, and a discharge device to discharge impurities in the chamber to the outside.

2 Claims, 1 Drawing Sheet

METHOD FOR REMOVING HAZE IN A PHOTO MASK

CROSS-REFERENCE TO RELATED APPLICATIONS

This is a division of U.S. application Ser. No. 11/770,528 filed Jun. 28, 2007, now abandoned, which claims the priority benefit under 35 USC 119 of KR 10-2006-138850 filed Dec. 29, 2006, the entire respective disclosures of which are Incorporated herein by reference.

BACKGROUND

The invention relates to an apparatus for removing haze in a photo mask and a method for removing haze in a photo mask.

As semiconductor device become more highly integrated, the sizes of patterns formed on a wafer decrease accordingly. To form such fine patterns, a photolithography process using a photo mask is used. With the photolithography process, a photoresist layer is applied onto a material layer on which a desired pattern will be formed, and light is irradiated onto a part of the photoresist layer through a photo mask having a predetermined, light shielding pattern. Subsequently, the irradiated part of the photoresist layer is removed by a developing process using a developer solution, so as to form a photoresist layer pattern. Thereafter, the photoresist layer pattern is used to expose a part of the material layer such that the exposed part of the material layer is removed by an etching process using the photoresist layer pattern as an etching mask. In this way, a material layer pattern, corresponding to the light shielding pattern of the photo mask, can be formed.

In the implementation of such a photolithography process, impurities on the photo mask may be transcribed onto the photoresist layer, thus making it impossible to achieve the photoresist layer pattern having a desired profile. Consequently, an unwanted pattern is possibly formed on the material layer. Moreover, if some of the impurities on the photo mask have a size exceeding a critical value, a haze, which is known as a growing defect having a gradually increasing size, may occur. Haze is a main reason for defective pattern transcription.

For this reason, a conventional method for fabricating a photo mask comprises a cleaning process for removing impurities caused during a patterning process. The cleaning process may be selected from among SPM (sulfuric acid peroxide mixture) cleaning, APM (ammonia peroxide mixture) cleaning, ultra-pure water cleaning processes, etc. The SPM cleaning process is for cleaning a photo mask at a predetermined temperature by use of a mixture of sulfuric acid and hydrogen peroxide. Due to the use of sulfuric acid, in this case, sulfate may remain on the photo mask. The APM cleaning process is for cleaning a photo mask at a predetermined temperature by use of a mixture of a very small amount of ammonia, hydrogen peroxide, and ultra-pure water. In this case, ammonia may remain on the photo mask. When occasion demands, rather than being directly formed on the surface of the photo mask, the above mentioned residues may first diffuse into a transparent substrate, a light shielding layer, and a phase shift layer, which constitute the photo mask, and then, erupt from the surface of the photo mask. Although the above described cleaning processes respectively remove the impurities on the surface of the photo mask, the cleaning processes may adversely result in residual ions causing haze.

The residual ions, caused by the cleaning processes, tend to react with any peripheral, highly reactive materials upon receiving light energy during an exposure process. If the size of the residual ions exceeds a critical value, haze occurs. As described above, the haze causes undesired pattern transcription.

BRIEF SUMMARY OF THE INVENTION

In one embodiment, the invention provides an apparatus for removing a haze formed in a photo mask including: a chamber having a bake module disposed therein to support the photo mask; a reactant gas feed line to feed a reactant gas into the chamber; and a discharge device to discharge impurities in the chamber to the outside of the chamber.

The bake module preferably includes a heat generator to increase the temperature of the photo mask above a predetermined temperature.

The reactant gas feed line preferably communicates with a source of reactant gas, preferably chlorine ($Cl_2$) gas.

The discharge device preferably includes a pump communicating with the chamber and a discharge line connected to the pump.

In other embodiment, the invention provides a method for removing a haze in a photo mask including the steps of: loading a photo mask into a chamber; increasing the temperature of the loaded photo mask to above a predetermined temperature; feeding a reactant gas into the chamber, thereby reacting the reactant gas and impurities present on the increased temperature photo mask to form a reaction product; and discharging the reaction product of the reactant gas and the impurities to the outside of the chamber.

The increased temperature of the photo mask is preferably sufficiently high to allow impurities diffused in the photo mask to erupt from the photo mask.

The reactant gas is preferably chlorine ($Cl_2$) gas, especially when the impurities include ammonia The method preferably further include the step of cleaning the photo mask with an ultra-pure water cleaning process or an ultra-pure ozone cleaning process, thereby removing residual reactant gas remaining after the reaction product is formed.

DETAILED DESCRIPTION OF THE INVENTION

Figure 1:
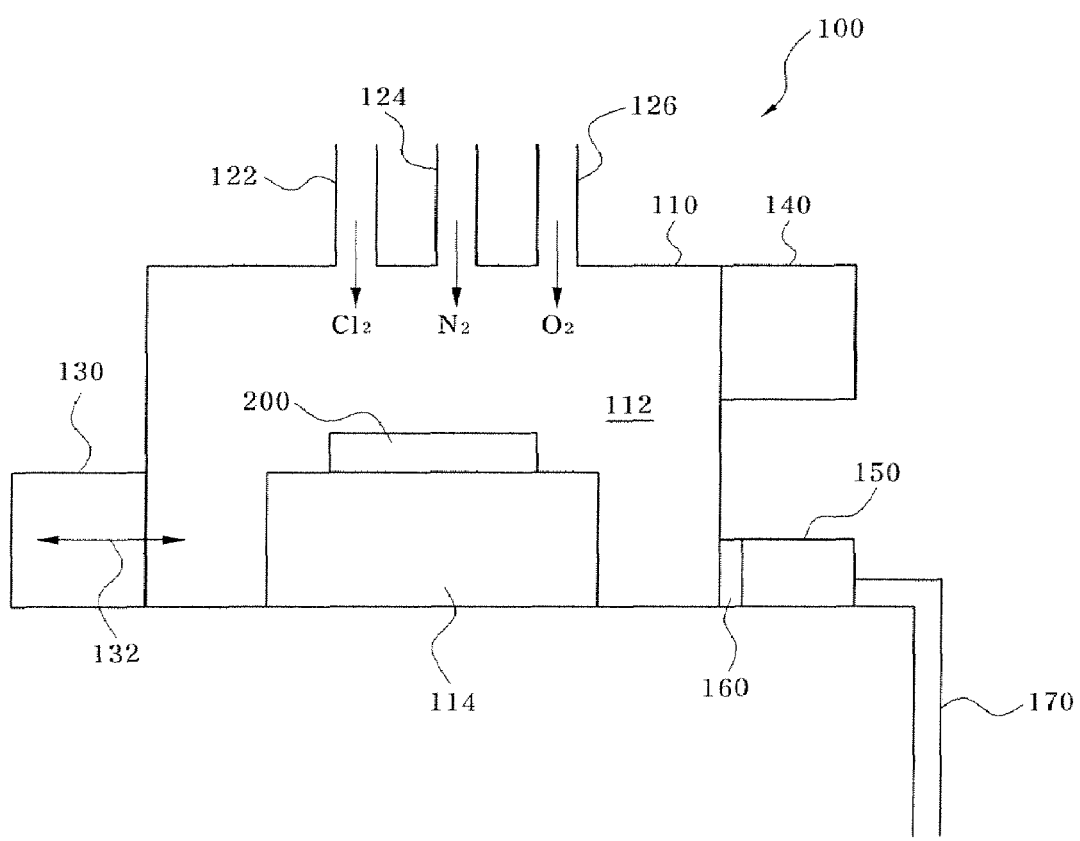
FIG. 1 is a view illustrating an apparatus and a method for removing a haze in a photo mask according to an embodiment of the invention.

An exemplary embodiment of the invention is described below in detail, with reference to the accompanying drawings. However, the invention may be embodied into a variety of different forms, and the scope of the invention is not limited to the following description.

FIG. 1 is a view illustrating an apparatus and a method for removing haze in a photo mask according to an embodiment of the invention. Referring to FIG. 1, an apparatus 100 for removing haze in a photo mask includes a chamber 110 having a defined internal space 112 sealed or isolated from the outside. A bake module 114 is disposed within the chamber 110, for example at the bottom of the chamber 110 as illustrated. A photo mask 200, from which haze will be removed, is supported on the bake module 114. When a haze removal process is in progress, the bake module 114 serves to raise the temperature of the photo mask 200 up to more than a predetermined temperature. For this, a hot wire (not shown) as another heating element may be disposed in the bake module 114. A reactant gas feed line 122 and purge gas feed lines 124 and 126 are connected to and communicate with the chamber 110, illustrated at the top thereof, opposite the bake module 114. Chlorine ($Cl_2$) gas, or another suitable reactant gas, is fed through the reacting gas feed line 122, into the internal space 112 of the chamber 110. Also, nitrogen ($N_2$) gas and/or oxygen ($O_2$) gas are fed through the purge gas feed lines 124 and 126, into the internal space 112 of the chamber 110.

A mask loader 130 is disposed at a sidewall of the chamber 110. The mask loader 130, as illustrated in the drawing by arrows 132, is used to load the photo mask 200 into the chamber 110 or unload the photo mask 200 from the chamber 110. A power module 140 and a pump 150 are disposed at an opposite sidewall of the chamber 110. The power module 140 supplies electricity to the haze removing apparatus 100. The pump 150 discharges contaminants within the internal space 112 of the chamber 110 to the outside. A valve 160 is disposed between the pump 150 and the chamber 110. The valve 160 maintains air pressure in the internal space 112 of the chamber 110 at a constant value. A discharge line 170 is connected to the pump 150. The contaminants, suctioned by the pump 150, are discharged to the outside through the discharge line 170.

The operating procedure of the haze removal apparatus 100 having the above described configuration is described as follows. First, the photo mask 200 is loaded into the chamber 110 by the mask loader 130. The loaded photo mask 200 is seated on the bake module 114. To remove impurities within the chamber 110, a purge gas, for example, $N_2$ gas and/or $O_2$ gas, is fed through the purge gas feed lines 124 and 126. Then, the pump 150 is operated to discharge all the impurities within the internal space 112 of the chamber 110 to the outside through the discharge line 170.

Subsequently, the temperature of the bake module 114 is raised such that the temperature of the photo mask 200 is more than a predetermined temperature. In this case, the predetermined temperature is a temperature sufficient to expel impurities (illustratively, ammonia), which have diffused into the photo mask 200 and may cause a haze when expelled from the photo mask 200. Thereafter, a reactant gas (illustratively, $Cl_2$ gas) is fed through the reactant gas feed line 122. The fed reactant gas reacts with the impurities on the surface of the photo mask 200, to thereby produce a reaction product (e.g., ammonium chloride ($NH_4Cl$)). As described above, since the temperature of the photo mask 200 is regulated such that the impurities, diffused into the photo mask 200, are erupted from the surface of the photo mask 200, the reaction between the reactant (e.g. $Cl_2$ gas) and the impurities (e.g. Ammonia) can be efficiently performed. The reaction product (e.g., $NH_4Cl$), produced via the reaction between the reactant gas and the impurities is discharged to the outside by feeding the purge gas and operating the pump 150.

After the temperature of the photo mask 200 is lowered, preferably to ambient temperature, the photo mask 200 is unloaded by the mask loader 130. The unloaded photo mask 200 has no impurities (e.g., ammonia) causing a haze. Finally, to remove residue reactant gas (e.g. chlorine) also causing a haze, the photo mask 200 is subjected to an ultra-pure water cleaning or ultra-pure ozone cleaning, for example.

As apparent from the foregoing description, with an apparatus and a method for removing haze in a photo mask according to the invention, impurities and residual reactant gases (e.g., ammonia and chlorine respectively) capable of causing haze can be easily removed. This prevents the generation of haze during a subsequent exposure process.

What is claimed is:

1. A method for removing haze-causing ammonia impurities in a photo mask comprising:
   loading a photo mask into a chamber;
   increasing a temperature of the loaded photo mask in order to expel ammonia impurities from inside the photo mask;
   feeding a reactant gas comprising chlorine ($Cl_2$) gas into the chamber, and reacting the reactant gas and the expelled ammonia impurities to form a reaction product; and
   discharging the reaction product of the reactant gas and the ammonia to the outside of the chamber, thereby removing ammonia impurities from the photo mask.

2. The method according to claim 1, further comprising:
   washing the photo mask with a cleaning process selected from the group consisting of a water cleaning process and an ozone cleaning process, thereby removing residual reactant gas remaining after the reaction product is formed.

* * * * *